(12) United States Patent
Jeong

(10) Patent No.: US 8,575,638 B2
(45) Date of Patent: Nov. 5, 2013

(54) LIGHT EMITTING DEVICE

(75) Inventor: HwanHee Jeong, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 19 days.

(21) Appl. No.: 13/283,152

(22) Filed: Oct. 27, 2011

(65) Prior Publication Data

US 2012/0049230 A1  Mar. 1, 2012

(30) Foreign Application Priority Data

Oct. 29, 2010  (KR) .................. 10-2010-0107139

(51) Int. Cl.
*H01L 33/00*  (2010.01)

(52) U.S. Cl.
USPC ............................................. 257/98; 257/99

(58) Field of Classification Search
USPC .................................................... 257/98, 99
See application file for complete search history.

(56) References Cited

U.S. PATENT DOCUMENTS

| 8,283,687 B2* | 10/2012 | Lee ................................ 257/98 |
| 2005/0184300 A1* | 8/2005 | Tazima et al. .................. 257/94 |
| 2007/0114545 A1* | 5/2007 | Jang et al. ...................... 257/94 |

* cited by examiner

*Primary Examiner* — Douglas Menz
(74) *Attorney, Agent, or Firm* — Lowe Hauptman & Ham LLP

(57) ABSTRACT

A light emitting device is disclosed. The disclosed light emitting device includes a light emitting structure comprising a first semiconductor layer, a second semiconductor layer, and an active layer interposed between the first and second semiconductor layers, an insulating layer contacting a lower surface of the light emitting structure, and a protective layer disposed beneath the light emitting structure, and formed with a pattern at which the insulating layer is arranged.

18 Claims, 7 Drawing Sheets

LIGHT EMITTING DEVICE

CROSS-REFERENCE TO RELATED APPLICATION

This application claims the priority benefit of Korean Patent Application No. 10-2010-0107139, filed on in Korea Oct. 29, 2010, the disclosure of which is incorporated herein by reference.

BACKGROUND OF THE EMBODIMENT

1. Field

This relates to a light emitting device.

2. Background

Fluorescent lamps are required to be frequently replaced due to occurrence of a dark spot, short lifespan, etc. Furthermore, they are inconsistent with demand for more environmentally friendly illumination devices due to use of fluorescent materials. For this reason, fluorescent lamps are gradually being replaced by other light sources.

Among light emitting devices, there is great interest in light emitting diodes (LEDs) as an alternative light source. The LED has advantages of semiconductors such as rapid processing speed and low power consumption, is environmentally friendly, and has high energy saving effects. Thus, the LED is a leading next-generation light source. In this regard, practical application of LEDs replacing existing fluorescent lamps is being actively conducted.

Currently, semiconductor light emitting devices such as LEDs are applied to televisions, monitors, notebooks, cellular phones, and various appliances equipped with display devices. In particular, they are widely used as backlight units replacing cold cathode fluorescent lamps (CCFLs).

Recently, light emitting devices are required to have high brightness so that they may be used as light sources for illumination. In order to achieve such high brightness, research into manufacture of a light emitting device capable of achieving uniform current diffusion, and thus, an enhancement in light emission efficiency, is being conducted.

SUMMARY

Embodiments provide a light emitting device achieving enhancements in light emission efficiency, stability, and reliability.

In one embodiment, a light emitting device includes a light emitting structure comprising a first semiconductor layer, a second semiconductor layer, and an active layer interposed between the first and second semiconductor layers, an insulating layer contacting below of the light emitting structure and a protective layer disposed below the light emitting structure, and formed with a pattern at which the insulating layer is arranged.

In another embodiment, a light emitting device includes a light emitting structure comprising a first semiconductor layer, a second semiconductor layer, and an active layer interposed between the first and second semiconductor layers, a protective layer formed with at least two protrusions contacting the first semiconductor layer and an insulating layer disposed among the at least two protrusions while contacting the first semiconductor layer.

In another embodiment, a light emitting device includes a light emitting structure comprising a first semiconductor layer, a second semiconductor layer, and an active layer interposed between the first and second semiconductor layers, an insulating layer contacting a portion of below of the first semiconductor layer and a protective layer disposed below the first semiconductor layer, wherein the protective layer is contacting the portion of the first semiconductor layer.

BRIEF DESCRIPTION OF THE DRAWINGS

The embodiments will be described in detail with reference to the following drawings in which like reference numerals refer to like elements wherein.

DETAILED DESCRIPTION

Figure 1:
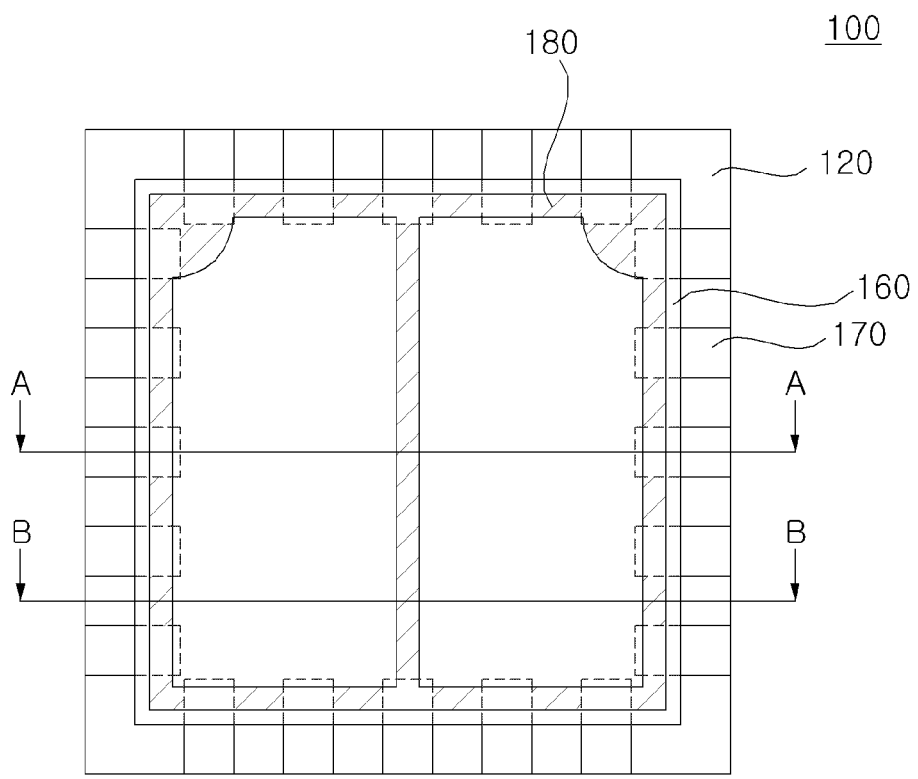
FIG. 1 is a plan view illustrating an upper surface of a light emitting device according to an exemplary embodiment.

Reference will now be made in detail to the preferred embodiments, examples of which are illustrated in the accompanying drawings.

Advantages and characteristics and methods for addressing the same will be clearly understood from the following embodiments taken in conjunction with the annexed drawings. However, embodiments are not limited and may be realized in other various forms. The embodiments are only provided to more completely illustrate and to render a person having ordinary skill in the art to fully understand the scope. The scope is defined only by the claims. Accordingly, in some embodiments, well-known processes, well-known device structures and well-known techniques are not illustrated in detail to avoid unclear interpretation. The same reference numbers will be used throughout the specification to refer to the same or like parts.

Spatially relative terms, "below", "beneath", "lower", "above", "upper" and the like may be used to indicate the relationship between one device or constituent elements and other devices or constituent elements, as shown in the drawings. It should be understood that the spatially relative terms include the direction illustrated in the drawings as well as other directions of devices during use or operation. For example, in a case in which the device shown in the drawing is reversed, a device arranged "below" or "beneath" the other device may be arranged "above" the other device. Accordingly, the exemplary term, "beneath" may include "below" or "beneath" and "above". The device may be arranged in other directions. As a result, the spatially relative terms may be construed depending on orientation.

Terms used in the specification are only provided to illustrate the embodiments and should not be construed as limiting the scope and spirit of the present invention. In the specification, a singular form of terms includes plural forms thereof, unless specifically mentioned otherwise. In the term "comprises" and/or "comprising" as used herein, the mentioned component, step, operation and/or device is not excluded from presence or addition of one or more other components, steps, operations and/or devices.

Unless defined otherwise, all terms (including technical and scientific terms) used herein may be intended to have meanings understood by those skilled in the art. In addition, terms defined in general dictionaries should not be interpreted abnormally or exaggeratedly, unless clearly specifically defined.

In the drawings, the thicknesses or sizes of respective layers are exaggerated, omitted or schematically illustrated for clarity and convenience of description. Therefore, the sizes of respective elements do not wholly reflect actual sizes thereof.

In addition, angles and directions referred to during description of a structure of a light emitting device are described based on illustration in the drawings. In the description of the structure of the light emitting device, if reference points with respect to the angles and positional relations are not clearly stated, the related drawing will be referred to.

Hereinafter, for further detailed illustration of the shape of the light emitting device according to embodiments, the light emitting device will be described based on a first direction (X) and a second direction (Y) vertical to the first direction (X).

Figure 2:
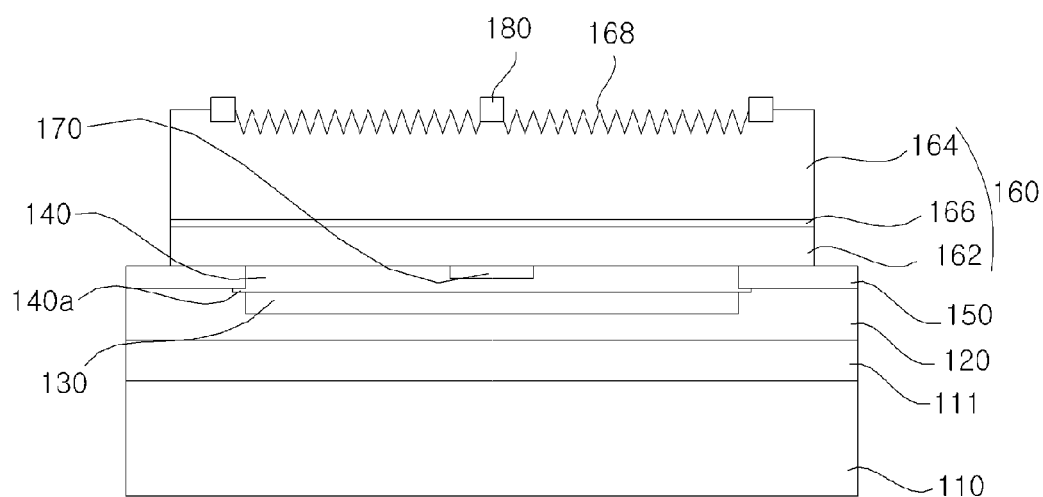
FIG. 2 is a cross-sectional view taken along a line A-A' in FIG. 1.
Figure 3:
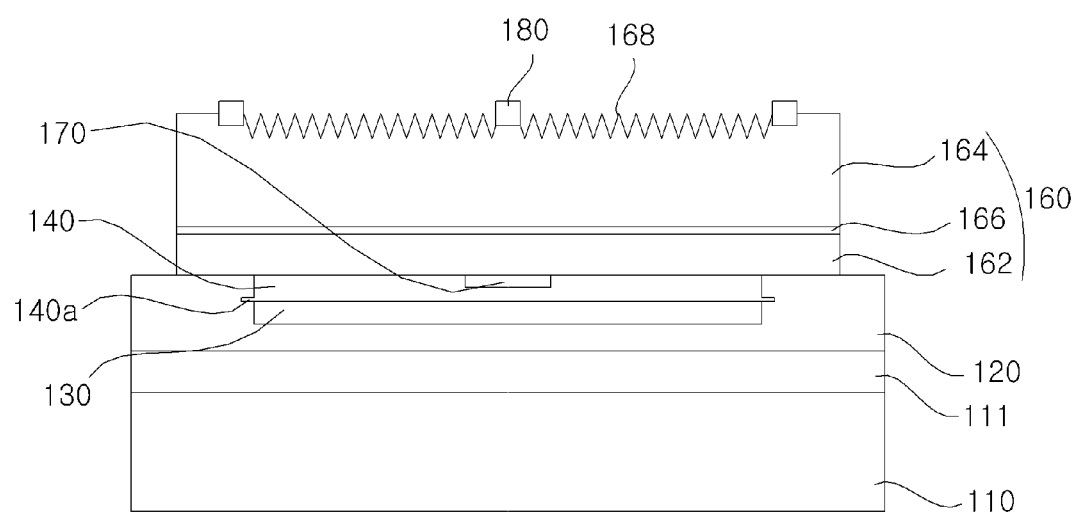
FIG. 3 is cross-sectional view taken along a line B-B' in FIG. 1.

FIG. 1 is a plan view illustrating an upper surface of a light emitting device according to an exemplary embodiment. FIG. 2 is a cross-sectional view taken along a line A-A' in FIG. 1. FIG. 3 is cross-sectional view taken along a line B-B' in FIG. 1.

Referring to FIGS. 1 to 3, the light emitting device, which is designated by reference numeral 100, may include a substrate 110, and a light emitting structure 160 disposed on the substrate 110.

The substrate 110 may be made of a material having excellent thermal conductivity. Alternatively, the substrate 110 may be made of a conductive material. For example, the substrate 110 may be made of a metal material or a conductive ceramic.

The substrate 110 may have a single-layer structure. Alternatively, the substrate 110 may have a double-layer structure or a multilayer structure having three or more layers.

Although the substrate 110 in the illustrated embodiment has been described as having conductivity, the present disclosure is not limited thereto. For example, the substrate 110 may be nonconductive.

When the substrate 110 is made of a metal material, the material of the substrate 110 may be one selected from gold (Au), nickel (Ni), tungsten (W), molybdenum (Mo), copper (Cu), aluminum (Al), tantalum (Ta), silver (Ag), platinum (Pt), chromium (Cr), and alloys thereof. The substrate 110 may be formed by laminating two or more layers of different materials.

The substrate 110 functions to easily dissipate heat generated from the light emitting device 100, and thus to achieve an enhancement in thermal stability.

When the substrate 110 is made of a semiconductor material, the material of the substrate 110 may be formed using a carrier wafer such as silicon (Si), germanium (Ge), gallium arsenide (GaAs), zinc oxide (ZnO), silicon carbide (SiC), silicon germanium (SiGe), gallium nitride (GaN), or gallium oxide ($Ga_2O_3$).

The substrate 110 may have light transmitting properties. For example, when the substrate 110 is formed to a predetermined thickness or less, using silicon (Si), it may have light transmitting properties. Of course, the substrate 110 is not limited to this condition.

The substrate 110 may be made of a material having high thermal conductivity. The substrate 110 may have a lower index of refraction than the light emitting structure 160 in order to achieve an enhancement in light extraction efficiency.

Also, the substrate 110 may be provided, at an upper surface thereof, with a patterned sapphire substrate (PSS) structure, in order to further enhance light extraction efficiency. Of course, the substrate 110 is not limited to the above-described condition or structure.

The substrate 110 may function to easily dissipate heat generated from the light emitting device 100, and thus to achieve an enhancement in the thermal stability of the light emitting device 100.

The formation of the substrate 110 may be achieved using an electro-chemical metal deposition method or a bonding method using eutectic metal.

A bonding layer 111 may be disposed on the substrate 110. The bonding layer 111 may function to minimize an electromigration phenomenon in which atoms in an electrode layer 140 migrate due to electric field during application of current. The bonding layer 111 may be made of at least one of a metal material exhibiting excellent bonding force to the material of an under layer and an adhesive.

An anti-diffusion layer (not shown) may be formed over the bonding layer 111, to prevent diffusion of current, although the present disclosure is not limited thereto.

The bonding layer 111 or the anti-diffusion layer may be made of at least one of copper (Cu), niobium (Nb), tin (Sn), indium (In), scandium (Sc), tantalum (Ta), vanadium (V), silicon (Si), silver (Ag), gold (Au), zinc (Zn), antimony (Sb), aluminum (Au), germanium (Ge), hafnium (Hf), lanthanum (La), magnesium (Mg), manganese (Mn), nickel (Ni), palladium (Pd), tungsten (W), ruthenium (Ru), molybdenum (Mo), iridium (Ir), rhodium (Rh), tantalum (Ta), zirconium (Zr), and titanium (Ti), or an alloy thereof. Thus, the bonding layer 111 may have a single-layer structure or a multilayer structure.

The light emitting structure 160 may include a first semiconductor layer 162, a second semiconductor layer 164, and an active layer 166 interposed between the first and second semiconductor layers 162 and 164.

The first semiconductor layer 162 may be made of a semiconductor compound. For example, the first semiconductor layer 162 may be implemented using Group III-V or Group II-VI compound semiconductors. The first semiconductor layer 162 may be doped with a first-conductivity-type dopant.

For example, the first semiconductor layer 162 may be implemented by a p-type semiconductor layer, to inject holes into the active layer 124. The p-type semiconductor layer may be made of a semiconductor material having a formula of $In_xAl_yGa_{1-x-y}N$ ($0 \leq x \leq 1$, $0 \leq y \leq 1$, and $0 \leq x+y \leq 1$). For example, the p-type semiconductor layer may be made of GaN, AlN, AlGaN, InGaN, InN, InAlGaN, AlInN, and may be doped with a p-type dopant such as Mg, Zn, Ca, Sr, or Ba.

The active layer 166 may be disposed over an upper surface of the first semiconductor layer 162.

The active layer 166 may include a region where electrons and holes are recombined. In accordance with recombination of electrons and holes, the active layer 166 transits to a lower energy level, so that it may generate light having a wavelength corresponding to the energy level.

The active layer 166 may be made of, for example, a semiconductor material having a formula of $In_xAl_yGa_{1-x-y}N$ ($0 \leq x \leq 1$, $0 \leq y \leq 1$, and $0 \leq x+y \leq 1$). The active layer 166 may have a double junction structure, a single quantum well structure or a multi-quantum well structure.

Accordingly, an increased number of electrons gather in a low energy level portion of the quantum well layer. As a result, recombination probability of electrons and holes is increased, so that enhanced light emission effects may be obtained. The active layer 166 may also have a quantum wire structure or a quantum dot structure.

A conductive clad layer (not shown) may be formed over and/or beneath the active layer 166. The conductive clad layer may be made of a semiconductor having a wider bandgap than a barrier of the active layer 166. For example, the conductive clad layer may be made of GaN, AlGaN or InAlGaN, or may have a super-lattice structure. The conductive clad layer may be doped with a dopant to have an n-type or p-type conductivity.

The second semiconductor layer 164 may be disposed over an upper surface of the active layer 166.

The second semiconductor layer 164 may be made of a semiconductor compound. For example, the second semiconductor layer 164 may be implemented using Group III-V or Group II-VI compound semiconductors. The second semiconductor layer 164 may be doped with a second-conductivity-type dopant. For example, the second semiconductor layer 164 may be implemented by an n-type semiconductor layer. The n-type semiconductor layer may be made of a GaN-based compound semiconductor such as GaN, AlGaN, or InGaN, and may be doped with an n-type dopant.

The second semiconductor layer 164 may be made of, for example, a semiconductor material having a formula of $In_xAl_yGa_{1-x-y}N$ ($0 \leq x \leq 1$, $0 \leq y \leq 1$, and $0 \leq x+y \leq 1$), for example, InAlGaN, GaN, AlGaN, InGaN, AlN, or InN, and may be doped with an n-type dopant such as Si, Ge, or Sn.

Meanwhile, the light emitting structure 160 may further include a third semiconductor layer (not shown) formed over the second semiconductor layer 164 while having an opposite polarity to the second semiconductor layer 164. Alternatively, the first semiconductor layer 162 may be implemented by a p-type semiconductor layer, and the second semiconductor layer 164 may be implemented by an n-type semiconductor layer. Thus, the light emitting structure 160 may include at least one of an N-P junction, an N-P-N junction, and a P-N-P junction.

The first semiconductor layer 162, active layer 166, and second semiconductor layer 164 may be formed using a metal organic chemical vapor deposition (MOCVD) method, a chemical vapor deposition (CVD) method, a plasma-enhanced chemical vapor deposition (PECVD) method, a molecular beam epitaxy (MBE) method, a hydride vapor phase epitaxy (HVPE) method, or a sputtering method. Of course, the formation method is not limited to the above-described methods.

The concentrations of the dopants in the first and second semiconductor layers 162 and 164 may be uniform or non-uniform. That is, various multilayer semiconductor layer structures may be provided, although the present disclosure is not limited thereto.

Contrary to the above-described embodiment, the first semiconductor layer 162 may be implemented by an n-type semiconductor layer, and the second semiconductor layer 164 may be implemented by a p-type semiconductor layer. That is, the formation positions of the first and second semiconductor layers 162 and 164 with respect to the active layer 166 may be reversed. However, the following description will be given in conjunction with the case in which the first semiconductor layer 162 is implemented using a p-type semiconductor layer, and is disposed near the substrate 110.

Irregularities 168 may be formed at a portion or an entire portion of the semiconductor layer 164, although the present disclosure is not limited thereto.

A reflection film 130 and an electrode layer 140 may be formed between the substrate 110 and the light emitting structure 160.

When a portion of light generated from the active layer 166 of the light emitting structure 160 is directed toward the substrate 110, the reflection film 130 reflects the light such that the reflected light is directed in an upward direction of the light emitting device 100. Thus, it may be possible to enhance the light extraction efficiency of the light emitting device 100.

In this regard, the reflection film 130 may be made of a material exhibiting high reflectance. The reflection film 130 may be made of a metal material including at least one of Ag, Ni, Al, Rh, Pd, Ir, Ru, Mg, Zn, Pt, Au, and Hf, or an alloy thereof. The reflection film 130 may have a multilayer structure using the above-described metal material or alloy and a material having light transmitting properties and conductivity such as indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO) or antimony tin oxide (ATO). In detail, the reflection film 130 may have a multilayer structure such as IZO/Ni, AZO/Ag, IZO/Ag/Ni, AZO/Ag/Ni, Ag/Cu, or Ag/Pd/Cu.

The electrode layer 140 ohmic-contacts the first semiconductor layer 162, to smoothly supply power to the light emitting structure 160. The electrode layer 140 may be formed selectively using a light-transmitting conductive material and a metal material. For example, the electrode layer 140 may be formed to have a single-layer structure or a multilayer structure, using at least one of ITO, IZO, IZTO, IAZO, IGZO, IGTO, AZO, ATO, gallium zinc oxide (GZO), $IrO_x$, $RuO_x$, $RuO_x$/ITO, Ni, Pt, Ru, Ir, Rh, Ta, Mo, Ti, Ag, W, Cu, Cr, Pd, V, Co, Nb, Zr, Ni/$IrO_x$/Au, and Ni/$IrO_x$/Au/ITO.

Meanwhile, the reflection film 130 and electrode layer 140 may have different widths. The reflection film 130 and electrode layer 140 may be formed through simultaneous curing thereof, so that excellent bonding force may be obtained.

Although the reflection film 130 and electrode layer 140 have been described as having different widths in the illustrated embodiment, they may have the same width. Of course, the present disclosure is not limited to the above-described conditions. Also, there is no limitation on the shape of the electrode layer 140.

A protrusion 140a may extend outwardly from a peripheral surface of the electrode layer 140.

The protrusion 140a may be partially overlapped with an insulating layer 150, to partially support the insulating layer 150. The insulating layer 150 will be described later.

A current blocking layer 170 may be interposed between the electrode layer 140 and the light emitting structure 160, although the present disclosure is not limited thereto.

The electrode layer 140 may be formed, at a central portion thereof, with a groove (not shown) to receive the current blocking layer 170, although the present disclosure is not limited thereto.

The current blocking layer 170 may be formed such that at least a portion thereof is vertically overlapped with an electrode pad 180, which will be described later. The current blocking layer 170 may function to reduce current crowding at a region where the electrode pad 180 is spaced apart from the substrate 110 by a minimum distance, thereby achieving an enhancement in the light emission efficiency of the light emitting device 100.

The current blocking layer 170 may be made of at least one of a material having electrical insulation properties, a material having a lower electrical conductivity than the reflection film 130 or bonding layer 111, and a material capable of forming a Schottky contact in cooperation with the first semiconductor layer 162. For example, the current blocking layer 170 may be made of at least one of ITO, IZO, IZTO, IAZO, IGZO, IGTO, AZO, ATO, ZnO, $SiO_2$, $SiO_x$, $SiO_xN_y$, $Si_3N_4$, $Al_2O_3$, $TiO_x$, $TiO_2$, Ti, Al, and Cr.

Meanwhile, the current blocking layer 170 may be interposed between the reflection film 130 and the electrode layer 140.

Although the current blocking layer 170 has been described as being disposed on the electrode layer 140 in the illustrated embodiment, a protective layer 120 or the insulating layer 150 may perform the same function as the current blocking layer 170. That is, where each of the reflection film 130 and electrode layer 140 is horizontally divided into separate portions, the protective layer 120 may be disposed to contact side surfaces of the divided portions of the reflection film 130 and electrode layer 140 while contacting the first semiconductor layer 162, to perform the same function as the current blocking layer 170. In this case, at least a portion of the protective layer 120 may be overlapped with the electrode pad 180, which will be described later.

The insulating layer 150 may be disposed at a pattern of the protective layer 120, to prevent current supplied from at least one of the substrate 110 and electrode layer 140 from being supplied to the first semiconductor layer 162 via the protective layer 120. That is, the insulating layer 150 may perform the same function as the current blocking layer 170. Of course, the present disclosure is not limited to the above-described structures.

The protective layer 120 may be interposed between the bonding layer 111 and the light emitting structure 160 while having the pattern, at which the insulating layer 150 is disposed. The pattern may be arranged around a portion of the protective layer 120 where the reflection film 130 and electrode layer 140 are disposed.

The protective layer 120 may be arranged inside and outside the light emitting structure 160. For example, the protective layer 120 may be arranged beneath the first semiconductor layer 162 at a peripheral portion of the first semiconductor layer 162 to contact the first semiconductor layer 162 at a region other than the pattern of the protective layer 120 and to be outwardly exposed at a peripheral surface of the protective layer 120. The protective layer 120 is also arranged at a central portion of the first semiconductor layer 162 where the reflection film 130 and electrode layer 140 are arranged, namely, inside the first semiconductor layer 162, to contact the first semiconductor layer 162.

That is, the protective layer 120 may have an inner portion disposed beneath the first semiconductor layer 162 while being overlapped with the first semiconductor layer 162, and an outer portion disposed beneath the first semiconductor layer 162 outside a peripheral surface of the first semiconductor layer 162.

In this case, the outer portion of the protective layer 120 may be disposed at a protective region arranged outside the peripheral surface of the first semiconductor layer 162, to protect the peripheral surface of the light emitting structure 160. The protective region may correspond to an upper peripheral portion of the light emitting device 100 having a stepped structure between the light emitting structure 160 and the substrate 110. Of course, the present disclosure is not limited to the above-described structures.

The protective layer 120 may be made of, for example, at least one of a metal material and an insulating material. When the protective layer 120 is made of a metal material, the metal material may exhibit lower electrical conductivity than the material of the electrode layer 140 in order to prevent power applied to the electrode layer 140 from being applied to the protective layer 120.

The protective layer 120 may be made of at least one of titanium (Ti), nickel (Ni), platinum (Pt), lead (Pb), rhodium (Rh), iridium (Ir), iron (Fe), molybdenum (Mo), vanadium (V), and tungsten (W). The protective layer 120 may have a multilayer structure.

As described above, the insulating layer 150 may be disposed at the pattern of the protective layer 120. The protective layer 120 contacts the first semiconductor layer 162 at a portion of the protective layer 120 other than the pattern. In accordance with this structure, it may be possible to achieve easy identification of an etching stop in an etching process of the light emitting structure 160.

The protective layer 120 may have a thickness of 1 to 10 μm. When the thickness of the protective layer 120 is less than 1 μm, it may be difficult to perform the process. On the other hand, when the thickness of the protective layer 120 exceeds 10 μm, it may be impossible to smoothly supply power to the electrode layer 140.

The protective layer 120 may include a first surface (not shown) disposed adjacent to the first semiconductor layer 162, and a second surface (not shown) opposing the first surface while being disposed close to the substrate 110. The pattern may be formed at the first surface.

In an exemplary embodiment, the pattern may include at least one of groove (not shown). Although the groove is illustrated as having a square shape, it may have a polygonal shape, a circular shape, or a shape having curved edges. Of course, the present disclosure is not limited to the above-described structures.

The pattern may include first and second grooves (not shown) spaced apart from each other. The first and second grooves may be identical in terms of at least one of shape and width. Of course, the present disclosure is not to the above-described condition.

The depth (not shown) of the pattern may be 0.3 to 0.7 times the thickness of the protective layer 120. When the depth of the pattern exceeds 0.7 times, a hole, which is not a groove, may be formed through the protective layer 120. On the other hand, when the depth of the pattern is less than 0.3 times, the insulation function of the insulating layer 150 may not be substantial. Furthermore, there may be no substantial increase in bonding force.

When the protective layer 120 is made of a metal material, the insulating layer 150 may prevent a short circuit from occurring between the protective layer 120 and the active layer 166 due to a small thickness of the first semiconductor layer 162. Thus, enhanced reliability may be obtained.

The insulating layer 150 may be made of at least one of aluminum oxide ($Al_2O_3$), silicon oxide ($SiO_2$), silicon nitride ($Si_3N_4$), aluminum nitride (AlN), titanium oxide ($TiO_x$), and silicon oxide nitride ($SiO_xN_y$).

The insulating layer 150 may have the same shape as the pattern. Also, the insulating layer 150 may be formed only within the pattern.

The electrode pad 180 may be formed on an upper surface of the second semiconductor layer 164. Irregularities 168 may be formed at a portion or entire portion of the upper surface of the second semiconductor layer 164 where the electrode pad 180 is not formed, by a certain etching method, in order to achieve an enhancement in light extraction efficiency.

The electrode pad 180 may be formed on a flat upper surface portion of the second semiconductor layer 164 where the irregularities 168 are not formed, or may be formed on an upper surface portion of the second semiconductor layer 164 where the irregularities 168 are formed. Of course, the electrode pad 180 is not limited to the above-described conditions.

In accordance with the shape of the irregularities 168, the position of the electrode pad 180 may be varied. Of course, the present disclosure is not limited to the above-described condition.

After comparing FIGS. 2 and 3, it may be seen that the insulating layer 150 contacts the first semiconductor layer 162 at a portion of the protective layer 120 where the pattern is formed, and the protective layer 120 contacts the first semiconductor layer 162 at a portion of the protective layer 120 where the pattern is not formed.

Since the protective layer 120 and insulating layer 150 alternately contact the first semiconductor layer 162, it may be possible to achieve easy identification of an etching stop in an etching process of the light emitting structure 160.

The protective layer 120 may have an increased area contacting the insulating layer 150 and first semiconductor layer 162, to obtain increased bonding force.

Figure 4:
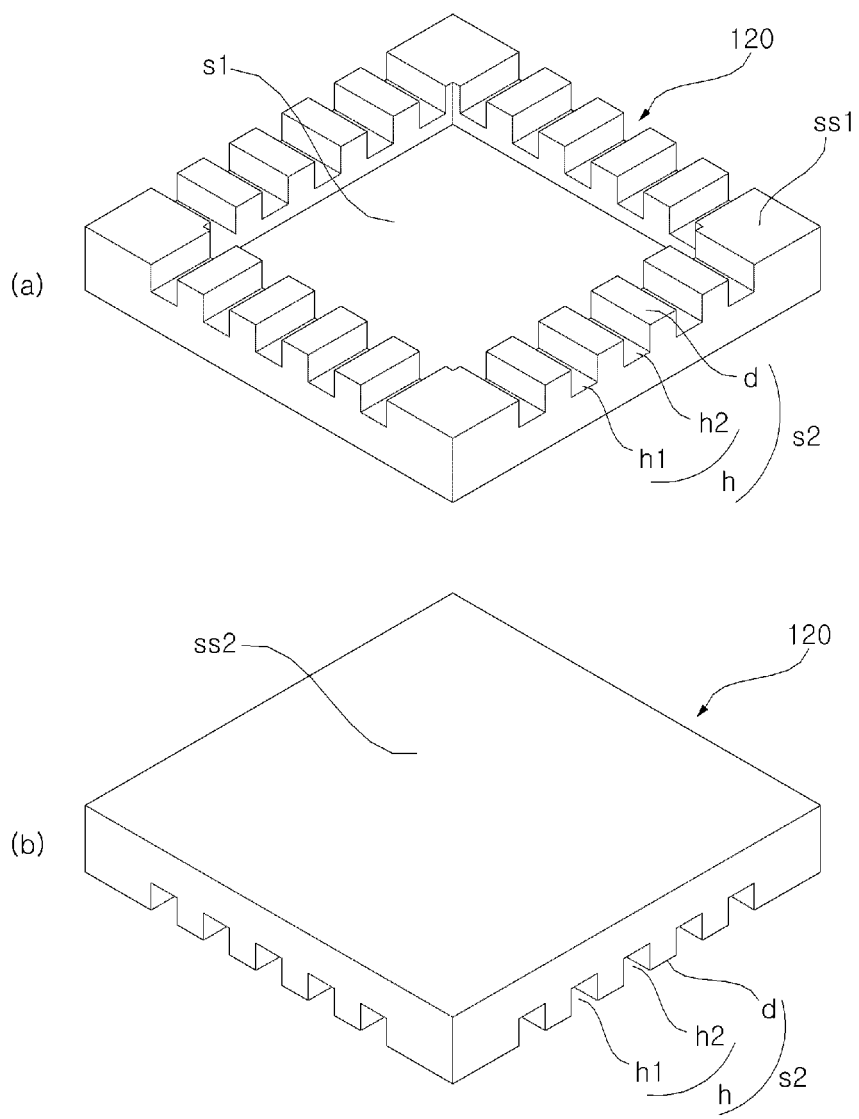
FIG. 4 is a perspective view illustrating first and second surfaces of a channel layer shown in FIG. 1.

FIG. 4 is a perspective view illustrating first and second surfaces of the protective layer as a channel layer shown in FIG. 1.

Referring to FIG. 4(a), the protective layer 120 may include a first surface ss1 having a first region s1 where the reflection film 130 and electrode layer 140 are arranged, and a second region s2 where a pattern h is formed. The first region s1 has a first thickness, and the second region s2 surrounds the first region s1.

The pattern h formed at the second region s2 may include a plurality of protrusions d contacting the first semiconductor layer 162, and a plurality of grooves each interposed between adjacent ones of the protrusions d. The plurality of grooves may include first and second grooves h1 and h2.

The second region s2 may have a second thickness greater than the first thickness. The difference between the first and second thicknesses may be varied in accordance with the sum of the thicknesses of the reflection film 130 and electrode layer 140.

For example, the second thickness may correspond to the sum of the first thickness and the thicknesses of the reflection film 130 and electrode layer 140. In this case, the protective layer 120 may easily contact the flat surface portion of the first semiconductor layer 162.

The protrusions d may contact the first semiconductor layer 162, to achieve an increase in bonding force. Although the protrusions d are illustrated as contacting a lower surface of the first semiconductor layer 162, they may penetrate into the first semiconductor layer 162 to achieve a further increase in bonding force. Of course, the present disclosure is not limited to the above-described structures.

The insulating layer 150 may be formed at the first and second grooves h1 and h2.

Although the first and second grooves h1 and h2 are illustrated as being opened at opposite sides thereof, they may have a polygonal structure opened at at least three sides thereof. Of course, the present disclosure is not limited to the above-described structures.

The first and second grooves h1 and h2 may have different widths, although the present disclosure is not limited thereto.

The insulating layer 150 may be formed only within the first and second grooves h1 and h2. Also, the insulating layer 150 may have a smaller size than the first and second grooves h1 and h2.

Referring to FIG. 4(b), the second surface ss2 of the protective layer 120 may oppose the first surface ss1 while being bonded to the substrate 110 by the bonding layer 111.

The second surface ss2 may be flat, and may be formed with a pattern to achieve an increase in bonding force, although the present disclosure is not limited thereto.

That is, the insulating layer 150 may be overlapped with the first semiconductor layer 162, as in the illustrated embodiment, or may not be overlapped with the first semiconductor layer 162, although the present disclosure is not limited thereto.

Figure 5:
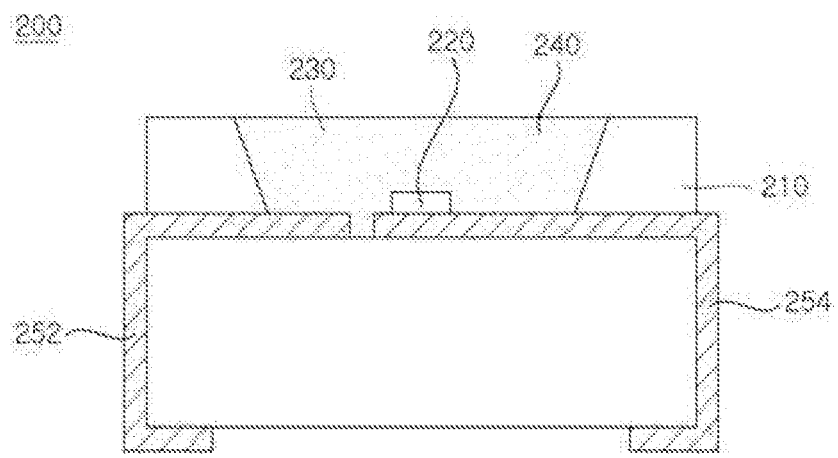
FIG. 5 is a sectional view of a light emitting device package including a light emitting device according to an exemplary embodiment.

FIG. 5 is a sectional view of a light emitting device package including a light emitting device according to an exemplary embodiment.

Referring to FIG. 5, the light emitting device package, which is designated by reference numeral "200", may include a body 210 formed with a cavity, a light emitting device 220 mounted on a bottom of the body 210, and a resin encapsulator 230 filling the cavity. The resin encapsulator 230 may contain a fluorescent substance 240.

The body 210 may be made of at least one of a resin material such as polyphthalamide (PPA), silicon (Si), aluminum (Al), aluminum nitride (AlN), liquid crystal polymer such as photo sensitive glass (PSG), polyamide 9T (PAST), sindiotactic polystyrene (SPS), a metal, sapphire ($Al_2O_3$), beryllium oxide (BeO), and ceramic, or may be a printed circuit board (PCB). The body 210 may be formed by an injection molding process, an etching process or the like, although the present disclosure is not limited thereto.

The body 210 may have an inclined surface at an inner surface thereof. In accordance with the inclination of the inclined surface, the reflection angle of light emitted from the light emitting device 220 may be varied. Thus, the orientation angle of outwardly emitted light may be adjusted.

When viewed from the top side, the cavity, which is formed at the body 210, may have a circular, rectangular, polygonal or elliptical shape. In particular, the cavity may have curved corners. Of course, the cavity is not limited to the above-described shapes.

The light emitting device 220 is mounted on the bottom of the body 210. For example, the light emitting device 220 may be the light emitting device illustrated in FIG. 1 and described with reference to FIG. 1. The light emitting device 220 may be, for example, a colored light emitting device to emit red, green, blue and white light, or an ultraviolet (UV) light emitting device to emit ultraviolet light, although it is not limited thereto. One or more light emitting devices may be mounted.

Meanwhile, the body 210 may include a first electrode 252 and a second electrode 254. The first and second electrodes 252 and 254 may be electrically connected to the light emitting device 220, to supply electric power to the light emitting device 220.

The first and second electrodes 252 and 254 are electrically isolated from each other. The first and second electrodes 252 and 254 may function to reflect light generated from the light emitting device 220, thereby enhancing light efficiency. The first and second electrodes 252 and 254 may also outwardly dissipate heat generated from the light emitting device 220.

The first and second electrodes 252 and 254 may be made of at least one of titanium (Ti), copper (Cu), nickel (Ni), gold (Au), chromium (Cr), tantalum (Ta), platinum (Pt), tin (Sn), silver (Ag), phosphor (P), aluminum (Al), indium (In), palladium (Pd), cobalt (Co), silicon (Si), germanium (Ge), hafnium (Hf), ruthenium (Ru), and iron (Fe), or an alloy thereof. The first and second electrodes 252 and 254 may have a single-layer structure or a multilayer structure, although the present disclosure is not limited thereto.

The resin encapsulator 230 may fill the cavity, and may include a fluorescent substance 240. The resin encapsulator 230 may be made of transparent silicon, epoxy resin, or other resin materials. The resin encapsulator 230 may be formed by filling the cavity with an encapsulating material, and curing the filled material using ultraviolet light or heat.

The kind of the fluorescent substance 240 may be selected in accordance with the wavelength of light emitted from the light emitting device 220 in order to realize emission of white light.

The fluorescent substance 240 contained in the resin encapsulator 230 may be a blue, bluish green, green, yellowish green, yellow, yellowish red, orange, or red light-emitting fluorescent substance in accordance with the wavelength of light emitted from the light emitting device 220.

That is, the fluorescent substance 240 may be excited by light emitted from the light emitting device 220 at a first wavelength, to generate light of a second wavelength. For example, when the light emitting device 220 is a blue light emitting diode, and the fluorescent substance 240 is a yellow fluorescent substance, the yellow fluorescent substance is excited by blue light, thereby emitting yellow light. In this case, the light emitting device package 200 may provide white light as the blue light generated from the blue light emitting diode and the yellow light generated in accordance with the excitation by the blue light are mixed.

Similarly, when the light emitting device 220 is a green light emitting diode, a magenta fluorescent substance or a mixture of blue and red fluorescent substances may be used as the fluorescent substance 240. Also, when the light emitting device 220 is a red light emitting diode, a cyan fluorescent substance or a mixture of blue and green fluorescent substances may be used as the fluorescent substance 240.

The fluorescent substance 240 may be a known fluorescent substance such as a YAG-based, TAG-based, sulfide-based, silicate-based, aluminate-based, nitride-based, carbide-based, nitridosilicate-based, borate-based, fluoride-based, or phosphate-based fluorescent substance.

Figure 6:
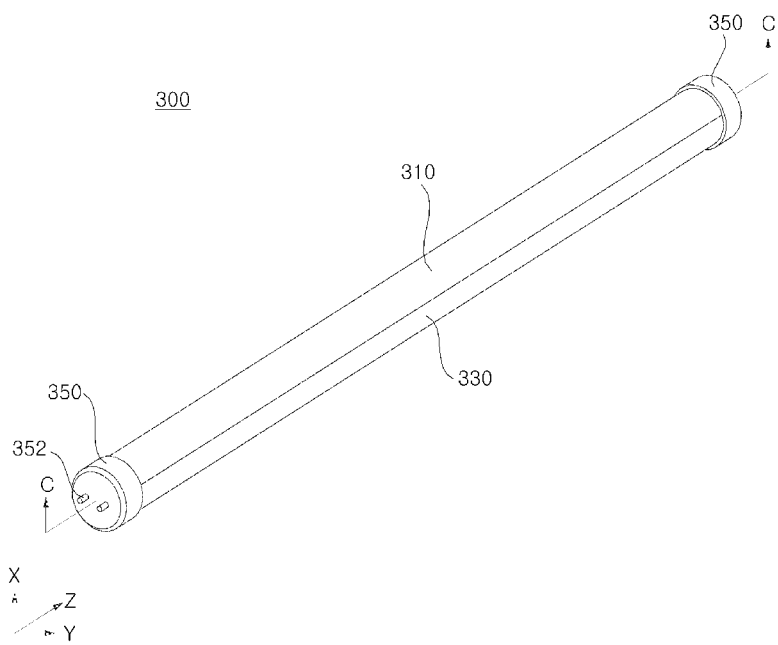
FIG. 6 is a perspective view illustrating a lighting apparatus including a light emitting device according to an exemplary embodiment.
Figure 7:
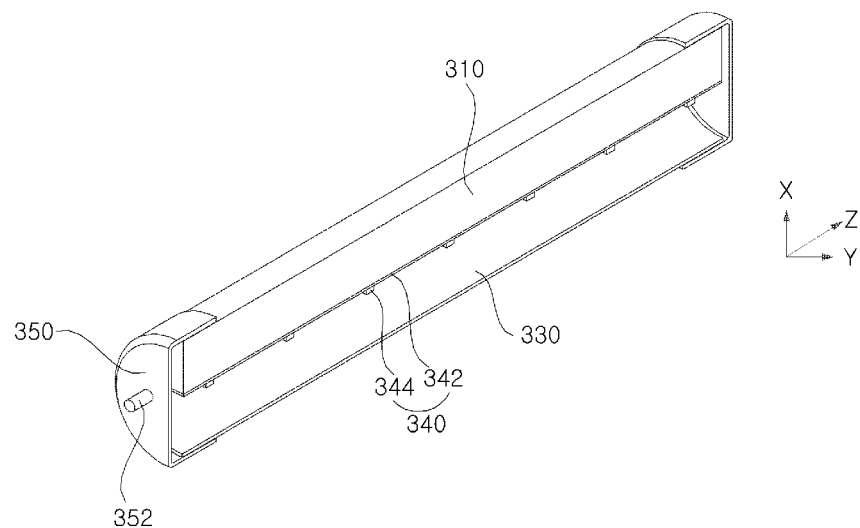
FIG. 7 is a cross-sectional view taken along a line C-C' in FIG. 6.

FIG. 6 is a perspective view illustrating a lighting apparatus including a light emitting device according to an exemplary embodiment. FIG. 7 is a cross-sectional view taken along a line C-C' in FIG. 6. In FIG. 6, the lighting apparatus is designated by reference numeral "300".

In the following description, to explain the shape of the lighting apparatus 300 according to the illustrated embodiment in more detail, the longitudinal direction of the lighting apparatus 300 is referred to as a "longitudinal direction Z", a horizontal direction perpendicular to the longitudinal direction Z is referred to as a "horizontal direction Y", and a height direction perpendicular to both the longitudinal direction Z and the horizontal direction Y is referred to as a "height direction X".

That is, FIG. 7 is a cross-sectional view taken along a Z-X plane of the lighting apparatus 300 shown in FIG. 6, and viewed in the horizontal direction Y.

Referring to FIGS. 6 and 7, the lighting apparatus 300 may include a body 310, a cover 330 coupled to the body 310, and end caps 350 located at both ends of the body 310.

A light emitting device module 340 is coupled to a lower surface of the body 310. The body 310 may be made of a metal material exhibiting excellent conductivity and excellent heat radiation effects to outwardly dissipate heat generated from the light emitting device module 340 through an upper surface of the body 310.

The light emitting device module 340 includes a PCB 342, and light emitting device packages 344 each including a light emitting device (not shown). The light emitting device packages 344 may be mounted on the PCB 342 in multiple rows while having various colors, to form a multi-color array. The light emitting device packages 344 may be mounted at the same distance, or may be mounted at different distances to enable brightness adjustment, if necessary. The PCB 342 may be a metal core PCB (MCPCB) or a flame retardant-4 (FR4) PCB.

The cover 330 may have a circular shape to surround the lower surface of the body 310, although the present disclosure is not limited thereto.

The cover 330 protects the light emitting device module 340 from external foreign matter, etc. The cover 330 may contain light diffusion particles to achieve anti-glare effects and uniform emission of light generated from the light emitting device packages 344. At least one of the inner and outer surfaces of the cover 330 may be provided with a prism pattern. Also, a fluorescent substance layer may be coated over at least one of the inner and outer surfaces of the cover 330.

Since the light generated from the light emitting device packages 344 is outwardly emitted through the cover 330, the cover 330 should have high light transmittance and heat resistance sufficient to endure heat generated from the light emitting device packages 344. To this end, the cover 330 may be formed of polyethylene terephthalate (PET), polycarbonate (PC) or polymethylmethacrylate (PMMA).

The end caps 350 may be disposed at both ends of the body 310 and function to seal a power supply device (not shown). Each end cap 350 is provided with power pins 352, so that the lighting apparatus 300 in accordance with the illustrated embodiment may be directly connected to a terminal without an additional connector.

Figure 8:
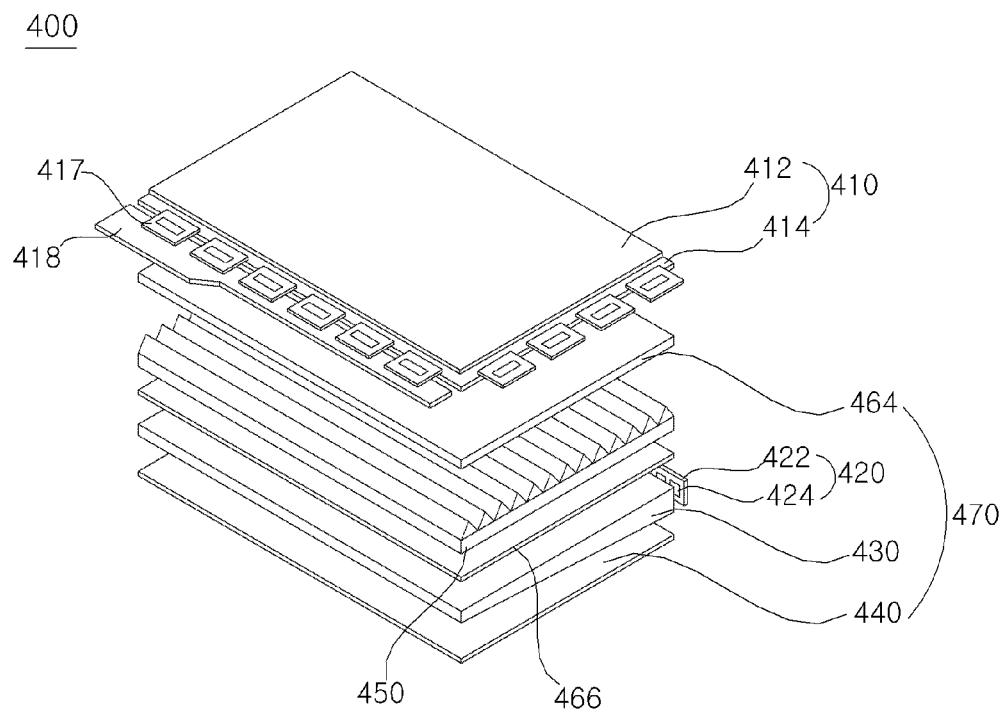
FIG. 8 is an exploded perspective view illustrating a liquid crystal display apparatus including a light emitting device according to an exemplary embodiment.

FIG. 8 is an exploded perspective view illustrating a liquid crystal display apparatus including a light emitting device according to an exemplary embodiment.

FIG. 8 illustrates an edge-light type liquid crystal display apparatus 400. The liquid crystal display apparatus 400 may include a liquid crystal display panel 410 and a backlight unit 470 to supply light to the liquid crystal display panel 410.

The liquid crystal display panel 410 may display an image using the light supplied from the backlight unit 470. The liquid crystal display panel 410 may include a color filter substrate 412 and a thin film transistor substrate 414, which are opposite each other with liquid crystals interposed therebetween.

The color filter substrate 412 may realize the color of an image displayed on the liquid crystal display panel 410.

The thin film transistor substrate 414 is electrically connected to a PCB 418, on which a plurality of circuit elements is mounted, by means of a drive film 417. The thin film transistor substrate 414 may apply drive voltage provided by the PCB 418 to liquid crystals in response to a drive signal transmitted from the PCB 418.

The thin film transistor substrate 414 may include pixel electrodes and thin film transistors in the form of thin films formed on another substrate made of a transparent material such as glass or plastic.

The backlight unit 470 includes a light emitting device module 420 to emit light, a light guide plate 430 to change light emitted from the light emitting device module 420 into planar light and to transmit the planar light to the liquid crystal display panel 410, a plurality of films 450, 466 and 464 to achieve uniformity in brightness distribution and improved vertical incidence of light emerging from the light guide plate 430, and a reflection sheet 440 to reflect light emitted rearwards from the light guide plate 430 toward the light guide plate 430.

The light emitting device module 420 may include a plurality of light emitting device packages 424 and a PCB 422 on which the plurality of light emitting device packages 424 is mounted to form an array.

Meanwhile, each light emitting device package 424 includes a light emitting device, which may be identical to that of FIG. 1 and, as such, no description thereof will be given.

The backlight unit 470 may include a diffusion film 466 to diffuse light incident thereupon from the light guide plate 430 toward the liquid crystal display panel 410, and a prism film 450 to condense the diffused light so as to enhance vertical light incidence. The backlight unit 470 may further include a protective film 464 to protect the prism film 450.

Figure 9:
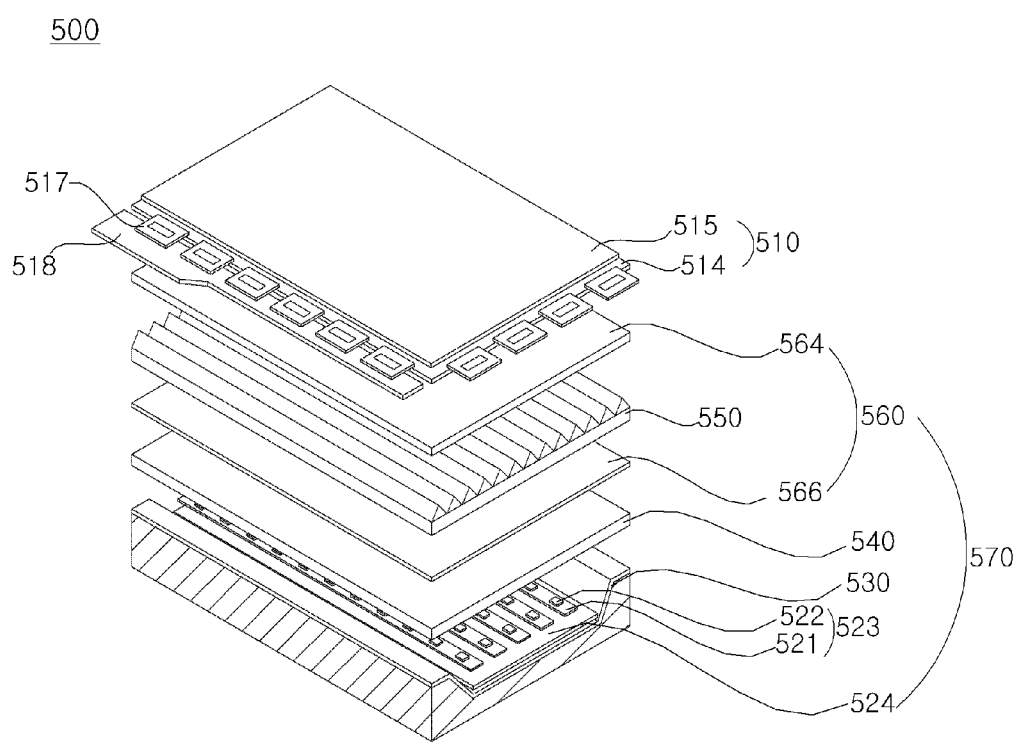
FIG. 9 is an exploded perspective view illustrating a liquid crystal display apparatus including a light emitting device according to another embodiment.

FIG. 9 is an exploded perspective view illustrating a liquid crystal display apparatus including a light emitting device according to another embodiment.

The same configuration as that illustrated in FIG. 8 and described with reference to FIG. 8 will not be repeatedly described in detail.

FIG. 9 illustrates a direct type liquid crystal display apparatus 500 including a liquid crystal display panel 510 and a backlight unit 570 to supply light to the liquid crystal display panel 510.

The liquid crystal display panel 510 is identical to that of FIG. 8 and, as such, no detailed description thereof will be given.

The backlight unit 570 may include a plurality of light emitting device modules 523, a reflection sheet 524, a lower chassis 530 in which the light emitting device modules 523 and reflection sheet 524 are accommodated, and a diffusion sheet 540 and a plurality of optical films 560, which are disposed over the light emitting device modules 523.

Each light emitting device module 523 may include a plurality of light emitting device packages 522, and a PCB 521 on which the plurality of light emitting device packages 522 is mounted to form an array.

The reflection sheet 524 reflects light generated by the light emitting device packages 522 toward the liquid crystal display panel 510, to achieve an enhancement in light utilization efficiency.

Meanwhile, the light generated from the light emitting device modules 523 is incident upon the diffusion sheet 540. The optical films 560 are disposed over the diffusion sheet 540. The optical films 560 may include a diffusion film 566, a prism film 550 and a protective film 564.

In an embodiment, the lighting apparatus and backlight unit may be included in a lighting system, although the present disclosure is not limited thereto.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
   a light emitting structure comprising a first semiconductor layer, a second semiconductor layer, and an active layer interposed between the first and second semiconductor layers;
   an insulating layer contacting a underside of the light emitting structure; and
   a protective layer disposed below the light emitting structure, and formed with a pattern at which the insulating layer is arranged,
   wherein the pattern includes at least one groove, and
   wherein the groove has a depth of at least one groove corresponding to 0.3 to 0.7 times a thickness of the protective layer.

2. The light emitting device of claim 1, wherein the protective layer is vertically overlapped with the light emitting structure and contacts a portion of the light emitting structure.

3. The light emitting device of claim 1, wherein the groove has a polygonal or semicircular cross-section.

4. The light emitting device of claim 1, further comprising:
   a substrate disposed below the protective layer,
   wherein the protective layer comprises
      a first surface formed with the pattern, and
      a second formed opposite the first surface, the first surface disposed closer to the first semiconductor layer than the second surface.

5. The light emitting device of claim 1, wherein the pattern is opened at at least one side surface of the protective layer.

6. The light emitting device of claim 1, wherein the protective layer comprises:
   a first region having a first thickness; and
   a second region including the pattern and surrounding the first region.

7. The light emitting device of claim 6, wherein the second region has a second thickness greater than the first thickness.

8. The light emitting device of claim 6, further comprising:
   an electrode layer disposed on the first region and contacting a underside of the first semiconductor layer.

9. The light emitting device of claim 8, further comprising:
   a reflection layer interposed between the protective layer and the electrode layer,
   wherein a width of the reflection layer is equal to or narrower than a width of the electrode layer.

10. The light emitting device of claim 9, wherein the reflection layer comprises at least one selected from the group consisting of Ag, Ni, Al, Rh, Pd, Ir, Ru, Mg, Zn, Pt, Au, and Hf.

11. The light emitting device of claim 8, further comprising:
    a current blocking layer interposed between the first semiconductor layer and the electrode layer,
    wherein the current blocking layer is made of a same material as at least one of the protective layer and the insulating layer.

12. The light emitting device of claim 1, wherein the protective layer comprises at least one selected from the group consisting of Ti, Ni, Pt, Pb, Rh, Ir, Fe, Mo, V, and W.

13. The light emitting device of claim 1, wherein the protective layer has a thickness of 1 to 10 μm.

14. The light emitting device of claim 1, wherein the insulating layer comprises at least one selected from the group consisting of $SiO_2$, $SiO_x$, $SiO_xN_y$, $Si_3N_4$, $Al_2O_3$, $TiO_x$, $TiO_2$, and AlN.

15. A light emitting device, comprising:
- a light emitting structure comprising a first semiconductor layer, a second semiconductor layer, and an active layer interposed between the first and second semiconductor layers;
- a protective layer formed with at least two protrusions contacting the first semiconductor layer; and
- an insulating layer disposed between the at least two protrusions and contacting the first semiconductor layer,
- wherein a height of the at least two protrusions corresponds to 0.3 to 0.7 times a thickness of the protective layer.

16. The light emitting device of claim 15, wherein at least one of the at least two protrusions penetrates into the first semiconductor layer.

17. A light emitting device, comprising:
- a light emitting structure comprising a first semiconductor layer, a second semiconductor layer, and an active layer interposed between the first and second semiconductor layers;
- an insulating layer contacting a portion on a underside of the first semiconductor layer; and
- a protective layer disposed below the first semiconductor layer and contacting the portion of the first semiconductor layer,
- wherein a thickness of the insulating layer corresponds 0.3 to 0.7 times a thickness of the protective layer.

18. The light emitting device of claim 17, wherein the insulating layer and the protective layer are alternately arranged.

* * * * *